(12) United States Patent
Nakajima (10) Patent No.: US 9,379,200 B2
(45) Date of Patent: Jun. 28, 2016

(54) MEMORY WITH A SILICIDE CHARGE TRAPPING LAYER

(71) Applicant: KABUSHIKI KAISHA TOSHIBA, Minato-Ku (JP)

(72) Inventor: Kazuaki Nakajima, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 142 days.

(21) Appl. No.: 14/197,912

(22) Filed: Mar. 5, 2014

(65) Prior Publication Data

US 2015/0171184 A1     Jun. 18, 2015

Related U.S. Application Data (60) Provisional application No. 61/915,768, filed on Dec. 13, 2013.

(51) Int. Cl.
| | |
|---|---|
| *H01L 29/51* | (2006.01) |
| *H01L 21/28* | (2006.01) |
| *H01L 29/423* | (2006.01) |
| *H01L 29/788* | (2006.01) |
| *H01L 27/115* | (2006.01) |

(52) U.S. Cl.
CPC ........ *H01L 29/517* (2013.01); *H01L 21/28273* (2013.01); *H01L 27/11521* (2013.01); *H01L 29/42324* (2013.01); *H01L 29/42332* (2013.01); *H01L 29/7881* (2013.01)

(58) Field of Classification Search
CPC ............. H01L 29/517; H01L 21/28273; H01L 27/11521; H01L 29/42324; H01L 29/42332; H01L 29/7881

USPC .......................................................... 257/326
See application file for complete search history.

(56) References Cited

U.S. PATENT DOCUMENTS

| | | | |
|---|---|---|---|
| 8,227,852 B2 | 7/2012 | Watanabe | |
| 8,354,706 B2 | 1/2013 | Kanemura et al. | |
| 2008/0042188 A1 | 2/2008 | Watanabe | |
| 2009/0121275 A1* | 5/2009 | Kim | H01L 21/28273 257/321 |
| 2011/0121381 A1 | 5/2011 | Kanemura et al. | |
| 2013/0214342 A1 | 8/2013 | Sato | |
| 2013/0292757 A1* | 11/2013 | Aritome | H01L 27/11556 227/316 |
| 2014/0339624 A1* | 11/2014 | Ramaswamy | H01L 29/792 257/326 |
| 2015/0084114 A1* | 3/2015 | Kim | H01L 21/28273 257/321 |
| 2015/0099354 A1* | 4/2015 | Aritome | H01L 27/11556 438/594 |

FOREIGN PATENT DOCUMENTS

| | | |
|---|---|---|
| JP | 2008-47704 | 2/2008 |
| JP | 2011-114057 | 6/2011 |
| JP | 2013-172081 | 9/2013 |

* cited by examiner

*Primary Examiner* — Peter Bradford
(74) *Attorney, Agent, or Firm* — Oblon, McClelland, Maier & Neustadt, L.L.P.

(57) ABSTRACT

A semiconductor device according to the present embodiment includes a semiconductor substrate. A first insulating film is provided on the semiconductor substrate. A charge trap layer is provided on the first insulating film and the charge trap layer includes a silicide layer made of a metal silicide. A second insulating film is provided on the charge trap layer. A control gate electrode is provided on the second insulating film.

7 Claims, 6 Drawing Sheets

MEMORY WITH A SILICIDE CHARGE TRAPPING LAYER

CROSS REFERENCE TO RELATED APPLICATIONS

This application is based upon and claims the benefit of priority from the prior U.S. Provisional Patent Application No. 61/915,768 filed on Dec. 13, 2013, the entire contents of which are incorporated herein by reference.

FIELD

The embodiments of the present invention relate to a semiconductor device and manufacturing method thereof.

BACKGROUND

In semiconductor memory devices such as a NAND flash memory, memory cells are more and more downscaled. When the memory cells are downscaled, a threshold voltage window (hereinafter, also "Vt window") of the memory cells is narrowed. When the Vt window of the memory cells is narrowed, signal differences (voltage differences) of read data are reduced and thus sense amplifiers may detect data erroneously.

To expand the Vt window of the memory, it is conceivable to use metal floating gates as floating gates. However, the metal floating gates are oxidized in the manufacturing process. Accordingly, the metal floating gates cannot continue to be metals.

DETAILED DESCRIPTION

Embodiments will now be explained with reference to the accompanying drawings. The present invention is not limited to the embodiments. In the embodiments, "an upper direction" or "a lower direction" refers to a relative direction when a direction of a surface of a substrate on which semiconductor elements are provided is assumed as "an upper direction". Therefore, the term "upper direction" or "lower direction" occasionally differs from an upper direction or a lower direction based on a gravitational acceleration direction.

A semiconductor device according to the present embodiment includes a semiconductor substrate. A first insulating film is provided on the semiconductor substrate. A charge trap layer is provided on the first insulating film and the charge trap layer includes a silicide layer made of a metal silicide. A second insulating film is provided on the charge trap layer. A control gate electrode is provided on the second insulating film.

A NAND flash memory as an example of the semiconductor device according to the present embodiment is explained below. However, the present embodiment is not limited to a NAND flash memory and is also applicable to other semiconductor devices.

First Embodiment

Figure 1:
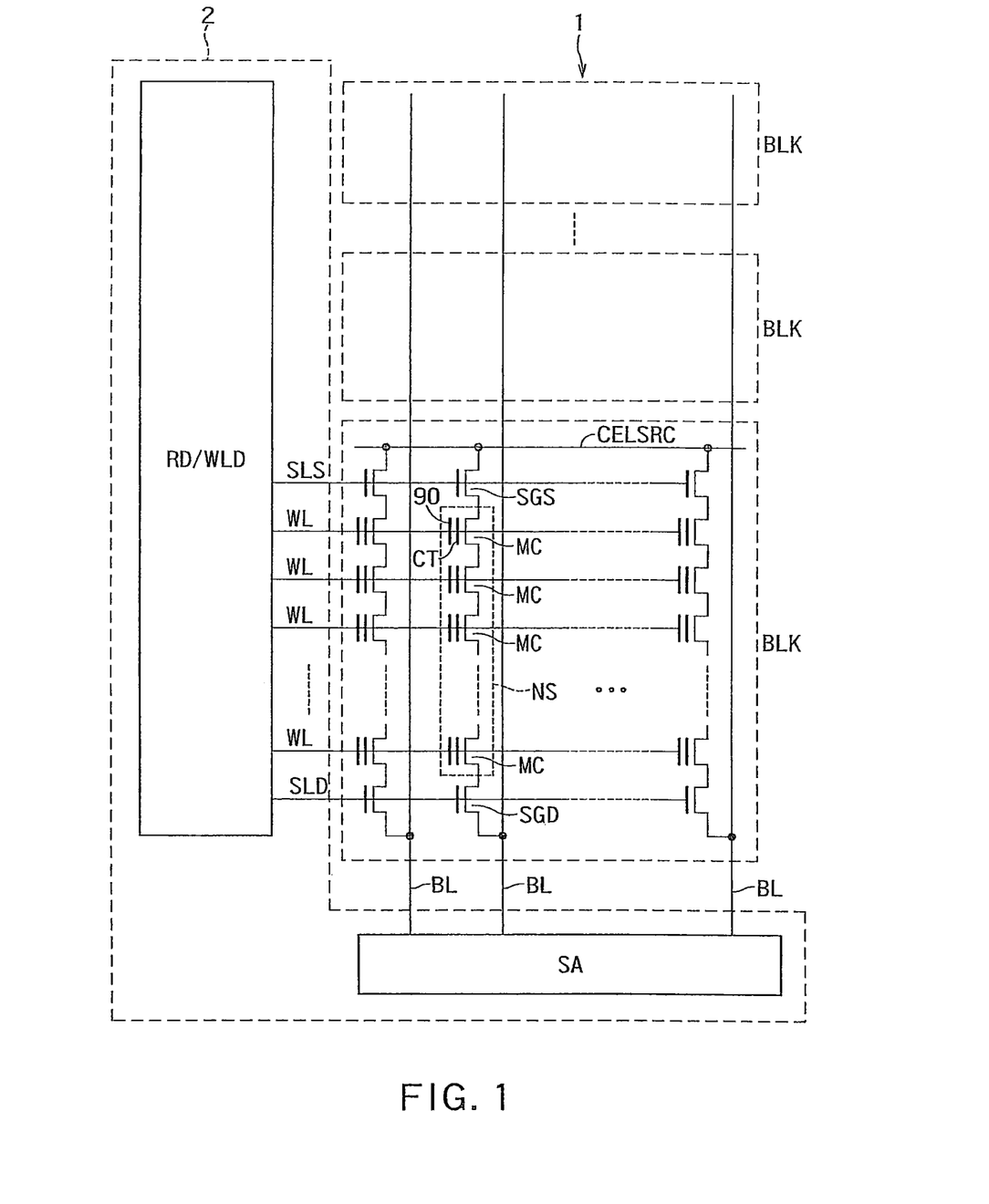
FIG. 1 shows an example of a configuration of a semiconductor device according to a first embodiment.

FIG. 1 shows an example of a configuration of a semiconductor device according to a first embodiment. The semiconductor device is, for example, a NAND flash memory (hereinafter, also simply "memory"). The memory includes a memory area 1 in which a plurality of memory cells MC are arranged two-dimensionally in a matrix and a peripheral circuit area 2 that controls the memory area 1.

The memory area 1 has a plurality of blocks BLK and each of the blocks BLK has a plurality of NAND strings NS. The blocks BLK are units of data erase, respectively. Each of the NAND strings NS has a plurality of memory cells MC connected in series. Memory cells MC on both ends of each of the NAND strings NS are connected to select gate transistors SGD and SGS, respectively. Memory cells MC on one end of the memory area 1 are connected to bit lines BL via the select gate transistors SGD, respectively, and memory cells MC on the other end of the memory area 1 are connected to a cell source CELSRC via the select gate transistors SGS, respectively.

Each of word lines WL is connected to control gates 90 of memory cells MC arrayed in a row direction. Select gate lines SLD and SLS are connected to gates of the select gate transistors SGD and SGS, respectively. The word lines WL and the select gate lines SLS and SLD are driven by a row decoder RD and a word line driver WLD.

Each of the bit lines BL is connected to plural ones of the NAND strings NS via the select gate transistors SGD, respectively. The bit lines BL are connected to a sense amplifier circuit SA. Plural ones of the memory cells MC connected to one word line WL constitute a page as a unit of collective data read or data write.

The select gate lines SLS and SLD drive the select gate transistors SGS and SGD, respectively, thereby connecting the NAND strings NS between the bit lines BL and the cell source CELSRC. The word line driver WLD drives non-selected ones of the word lines WL, thereby bringing non-selected ones of the memory cells MC into an ON state. In this way, the sense amplifier circuit SA can apply a voltage to selected memory cells MC via the corresponding bit lines BL, respectively. Accordingly, the sense amplifier circuit SA can detect data of the selected memory cells MC or write data in the selected memory cells MC.

Figure 2:
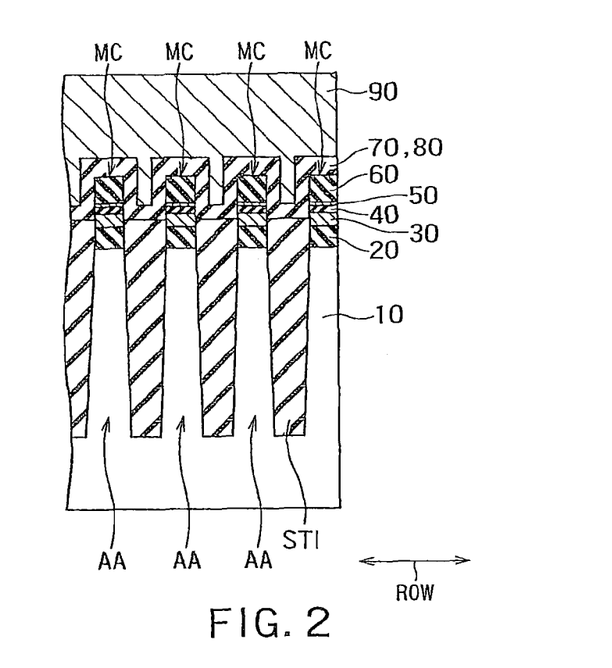
FIG. 2 is a cross-sectional view showing an example of a configuration of the memory cells MC according to the first embodiment.
Figure 3:
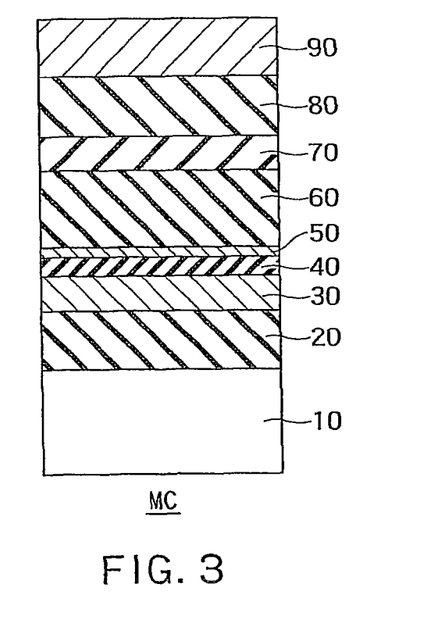
FIG. 3 is a schematic diagram showing layers of the memory cells MC in more detail.

FIG. 2 is a cross-sectional view showing an example of a configuration of the memory cells MC according to the first embodiment. FIG. 3 is a schematic diagram showing layers of the memory cells MC in more detail. FIG. 2 shows a cross-section along an extension direction of the word lines WL (the row direction). The configuration of the memory cells MC is explained with reference to FIGS. 2 and 3.

Each of the memory cells MC includes a substrate 10, a tunnel dielectric film 20, a floating gate 30, an IFD (Inter-Facial Dielectric) film 40, a metal silicide film (a CT (Charge Trap) film) 50, an inter-gate dielectric film 60, inter-gate dielectric films 70 and 80, and the control gate 90. A diffusion layer provided in the substrate 10 is omitted in FIGS. 2 and 3.

The substrate 10 is a semiconductor substrate such as a silicon substrate. AA in FIG. 2 denotes an active area and STI denotes a shallow trench isolation area.

The tunnel dielectric film 20 is provided on the substrate 10. The tunnel dielectric film 20 serving as a first insulating film is formed using an insulating film such as a silicon dioxide film. The floating gate 30 is provided on the tunnel dielectric film 20. The floating gate 30 is a semiconductor layer formed using a conductive material such as doped polysilicon.

The floating gate 30 accumulates therein charges (electrons, for example) from the substrate 10 via the tunnel dielectric film 20 or emits charges to the substrate 10 via the tunnel dielectric film 20. This changes a threshold voltage of the memory cell MC and thus the memory cell MC can store therein logical data.

The IFD film 40 is provided on the floating gate 30. The IFD film 40 is formed using an insulating film such as a silicon nitride film.

The metal silicide film 50 is provided on the IFD film 40. The metal silicide film 50 is formed using a metal silicide such as $Ru_2Si_3$, $Ir_2Si_3$, or $Rh_2Si_3$. The metal silicide film 50 also can accumulate therein charges (electrons, for example) from the substrate 10 or emit charges to the substrate 10. That is, the metal silicide film 50 functions as a CT film. This changes the threshold voltage of the memory cell MC and thus the memory cell MC can store therein logical data. Accordingly, the floating gate 30 and the metal silicide film 50 both function as a charge trap layer CT.

The inter-gate dielectric films 60 to 80 serving as a second insulating film are provided on the metal silicide film 50. The inter-gate dielectric films 60 and 80 are formed using a high-dielectric material, such as $HfO_2$, having a higher relative permittivity than that of a silicon dioxide film. The inter-gate dielectric film 70 is formed using an insulating film such as a silicon dioxide film or $Al_2O_3$. The inter-gate dielectric film 60 is processed together with the metal silicide film 50 during processing of the floating gates 30. The inter-gate dielectric films 70 and 80 are processed during processing of the control gates 90. Therefore, the inter-gate dielectric film 60 has a similar layout pattern to that of the floating gates 30 and the inter-gate dielectric films 70 and 80 have similar layout patterns to that of the control gates 90, respectively.

The control gate 90 is provided on the inter-gate dielectric film 80. The control gate 90 is formed using a conductive material such as tungsten or a tungsten nitride film.

Interlayer dielectric films, wirings, and the like (not shown) are formed on the control gate 90.

Figure 10:
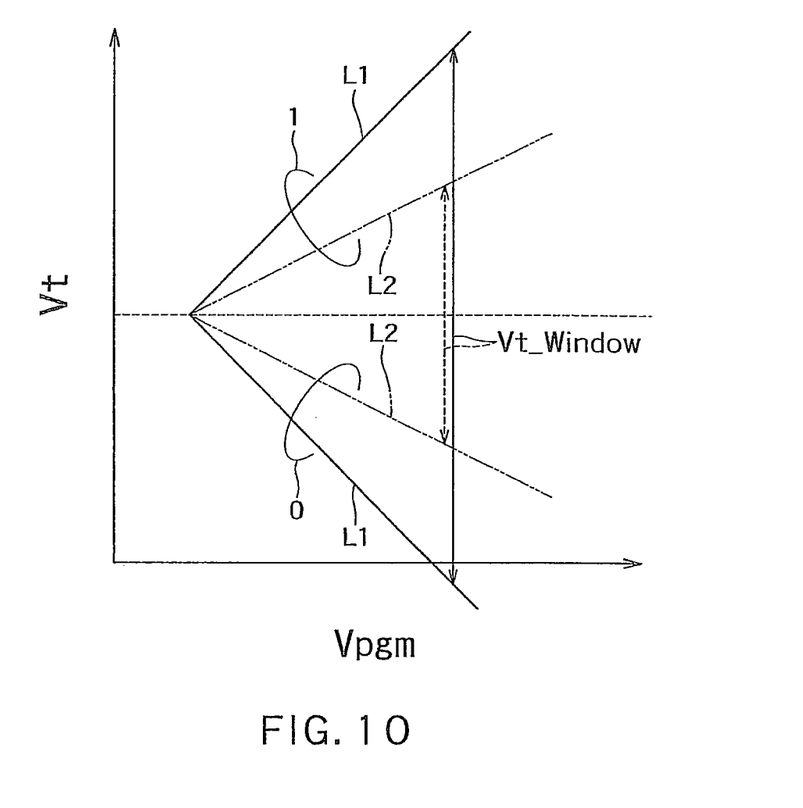
FIG. 10 is a graph showing Vt windows.

The memory according to the first embodiment has the metal silicide film 50 including a metal as well as the floating gates 30 made of polysilicon as the charge trap layer CT. For example, in a case where a metal having a relatively-high work function such as ruthenium, iridium, or rhodium is used for the metal silicide film 50, the energy band of the metal silicide film 50 greatly changes when a positive voltage is applied to the control gates 90 during data write. This enables the metal silicide film 50 to easily accumulate charges therein. When the metal silicide film 50 as well as the floating gates 30 accumulates charges therein, differences in threshold voltages of the memory cells MC are increased. That is, differences (signal differences) between threshold voltages of the memory cells MC that store therein data "0" and threshold voltages of the memory cells MC that store therein data "1" are increased. Accordingly, the Vt window of the memory cells MC is widened as shown in FIG. 10. FIG. 10 is a graph showing Vt windows. Solid lines L1 represent threshold voltages Vt of the memory according to the first embodiment and broken lines L2 represent threshold voltages Vt of a memory not including the metal silicide film 50. In FIG. 10, threshold voltages Vt of the data "0" and the data "1" for a write voltage Vpgm are shown with respect to each of the solid lines L1 and the broken lines L2. As shown in FIG. 10, the memory according to the first embodiment can obtain a wider Vt window.

Furthermore, because the metal silicide film 50 can easily accumulate charges therein, charges do not easily leak to the control gates 90 via the inter-gate dielectric films 60 to 80. That is, the metal silicide film 50 can increase the signal differences between the memory cells MC and also can suppress leakage of charges during data write. While ruthenium can be described as the material of the metal silicide film 50, the same holds true for other metals such as iridium and rhodium.

If a metal film is used instead of the metal silicide film 50, the metal film is oxidized in the manufacturing step. For example, if ruthenium is deposited on the IFD film 40, ruthenium is oxidized by the inter-gate dielectric film 60 ($HfO_2$, for example) deposited thereon. The melting point of a ruthenium oxide ($RuO_4$) is about 25° C. and the boiling point thereof is about 100° C. Therefore, the ruthenium oxide evaporates or sublimates in the subsequent heat treatments. That is, a metal such as ruthenium cannot be left as it is between the IFD film 40 and the inter-gate dielectric film 60. Even if ruthenium can be left, the amount of ruthenium between the IFD film 40 and the inter-gate dielectric film 60 changes due to evaporation or sublimation. Accordingly, characteristics (the Vt window, for example) of the memory cells MC are not stable.

On the other hand, the melting point of a ruthenium silicide ($Ru_2Si_2$) is about 1700° C. Therefore, the ruthenium silicide is much more stable than ruthenium itself and can be easily left between the IFD film 40 and the inter-gate dielectric film 60. That is, according to the first embodiment, stable metal floating gates can be left between the IFD film 40 and the inter-gate dielectric film 60 by using not a metal itself but a metal silicide in the charge trap layer CT. This enables the memory according to the first embodiment to stably maintain a widening effect on the Vt window and a suppressing effect on charge leakage as mentioned above.

Figure 4:
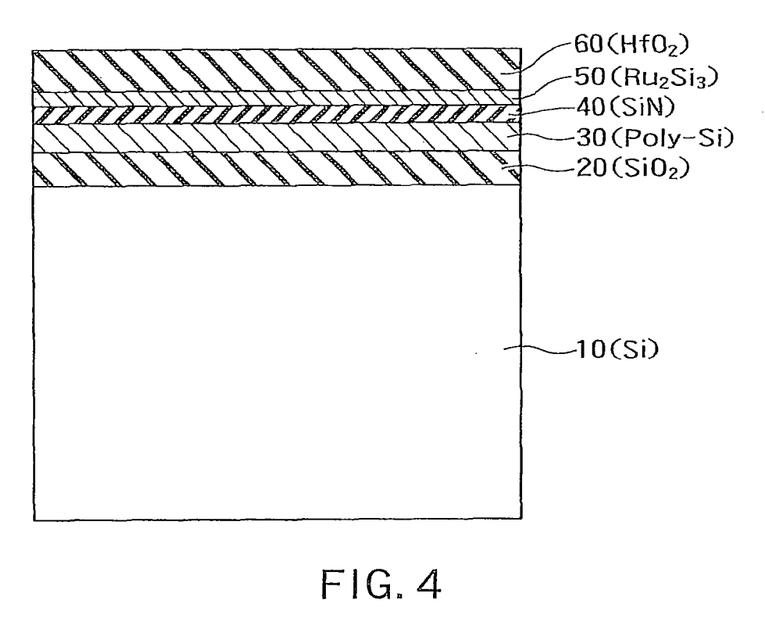
FIGS. 4 to 7 are cross-sectional views showing a manufacturing method of the memory according to the first embodiment.

FIGS. 4 to 7 are cross-sectional views showing a manufacturing method of the memory according to the first embodiment. As shown in FIG. 4, the tunnel dielectric film 20 serving as the first insulating film is first formed on the semiconductor substrate 10. The tunnel dielectric film 20 is, for example, a silicon dioxide film formed by thermally-oxidizing the semiconductor substrate 10.

Materials of the floating gates 30 and the IFD film 40 are then deposited on the tunnel dielectric film 20. The material of the floating gates 30 is, for example, doped polysilicon. The material of the IFD film 40 is, for example, a silicon nitride film.

Ruthenium is then deposited on the IFD film 40 using a PVD (Physical Vapor Deposition) method. Silicon is then deposited on ruthenium. Ruthenium is then silicided by annealing the substrate 10 in an oxygen-free atmosphere. In this way, the metal silicide film 50 made of $Ru_2Si_3$ is formed on the IFD film 40. Ruthenium and silicon can be deposited simultaneously by the PVD method. By performing annealing in an oxygen-free atmosphere, ruthenium is silicided without oxidized. Therefore, ruthenium does not evaporate or sublimate and leaves as a silicide.

A material of the inter-gate dielectric film 60 is then deposited on the metal silicide film 50. The material of the inter-gate dielectric film 60 is, for example, $HfO_2$. In this way, a structure shown in FIG. 4 is obtained.

The floating gates 30 and the metal silicide film 50 function as the charge trap layer CT. The IFD film 40 between the floating gates 30 and the metal silicide film 50 is provided to suppress impurities in the floating gates 30 and the metal of the metal silicide film 50 from diffusing to each other.

Figure 5:
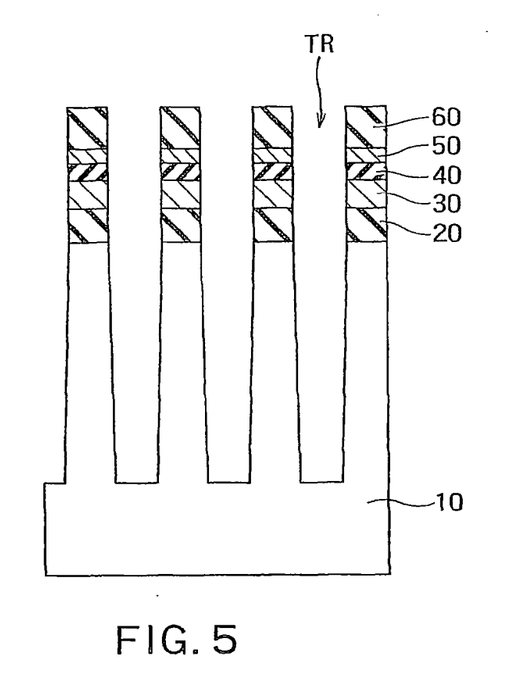

Trenches TR for element isolation are then formed using a lithographic technique and an RIE (Reactive Ion Etching) method. The lithographic technique can be any of a photolithographic method, a sidewall transfer method, and a nanoimprint method. In this way, the floating gates 30, the IFD film 40, the metal silicide film 50, and the inter-gate dielectric film 60 are isolated in the row direction for each of the memory cells MC, as shown in FIG. 5.

Figure 6:
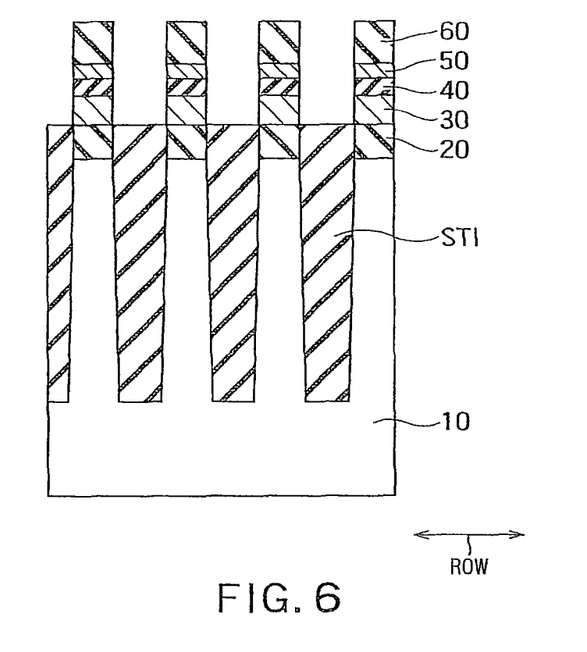

An insulating film is then embedded in the trenches TR. The insulating film is a silicon dioxide film, for example. The insulating film is then planarized using a CMP (Chemical Mechanical Polishing) method. The insulating film is then etched back in such a manner that an upper surface of the insulating film becomes lower than upper surfaces of the floating gates 30. In this way, the shallow trench isolation areas STI are formed as shown in FIG. 6.

Figure 7:
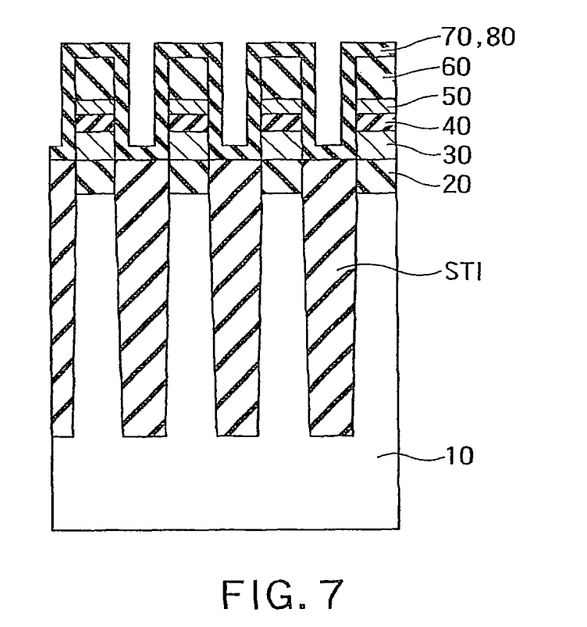

The inter-gate dielectric films 70 and 80 are then deposited on side and top surfaces of the floating gates 30, the IFD film 40, the metal silicide film 50, and the inter-gate dielectric film 60 as shown in FIG. 7. The inter-gate dielectric film 70 is a silicon dioxide film, for example, and the inter-gate dielectric film 80 is $HfO_2$, for example.

A material of the control gates 90 is then deposited on the inter-gate dielectric films 70 and 80. The control gates 90 are formed using, for example, polysilicon or a metal silicide. Each of the control gates 90 is fallen toward the corresponding shallow trench isolation area STI on both sides of adjacent ones of the floating gates 30, similarly to the inter-gate dielectric films 70 and 80.

After the control gates 90 and the inter-gate dielectric films 70 and 80 are processed, interlayer dielectric films, the bit lines BL, and the like are formed, thereby completing the memory shown in FIG. 2.

In the manufacturing method according to the first embodiment, a metal is silicided to form a part of the charge trap layer CT. A metal silicide ($Ru_2Si_3$, $Ir_2Si_3$, or $Rh_2Si_3$, for example) is more stable than the corresponding metal itself and can be easily left between the IFD film 40 and the inter-gate dielectric film 60. This enables the memory according to the first embodiment to have a stable wide Vt window. Furthermore, the memory according to the first embodiment can suppress leakage.

Second Embodiment

Figure 8:
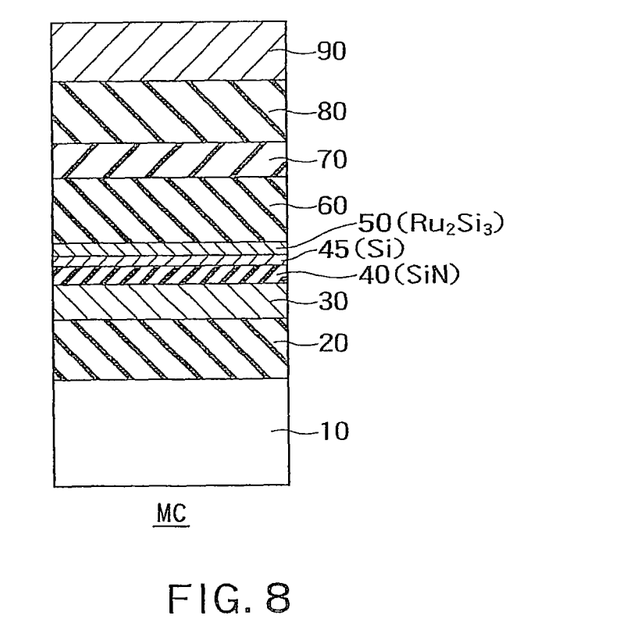
FIG. 8 is a cross-sectional view showing an example of a configuration of a memory according to a second embodiment.

FIG. 8 is a cross-sectional view showing an example of a configuration of a memory according to a second embodiment. The memory according to the second embodiment includes a silicon layer 45 between the IFD film 40 and the metal silicide layer 50. The silicon layer 45 serving as a second semiconductor layer is formed using, for example, polysilicon. The silicon layer 45 is provided to suppress reactions between the metal silicide layer 50 and the floating gates 30. Other configurations of the second embodiment can be identical to corresponding ones of the first embodiment.

It suffices to deposit the silicon layer 45 after deposition of the material of the IFD film 40 of the first embodiment. Other processes of the manufacturing method according to the second embodiment can be identical to corresponding ones of the manufacturing method according to the first embodiment. Accordingly, the second embodiment can achieve effects identical to those of the first embodiment. Furthermore, the second embodiment can suppress reactions between the metal silicide layer 50 and the floating gates 30.

Third Embodiment

In a memory according to a third embodiment, nitrogen is added to the metal silicide layer 50. By adding nitrogen to the metal silicide layer 50, diffusion of a metal (ruthenium, iridium, or rhodium, for example) in the metal silicide layer 50 can be suppressed. Other configurations of the third embodiment can be identical to corresponding ones of the first embodiment. Because the configurations of the memory according to the third embodiment are similar to those of the memory according to the first embodiment, illustrations thereof will be omitted. The third embodiment can be easily combined with the second embodiment.

Fourth Embodiment

Figure 9:
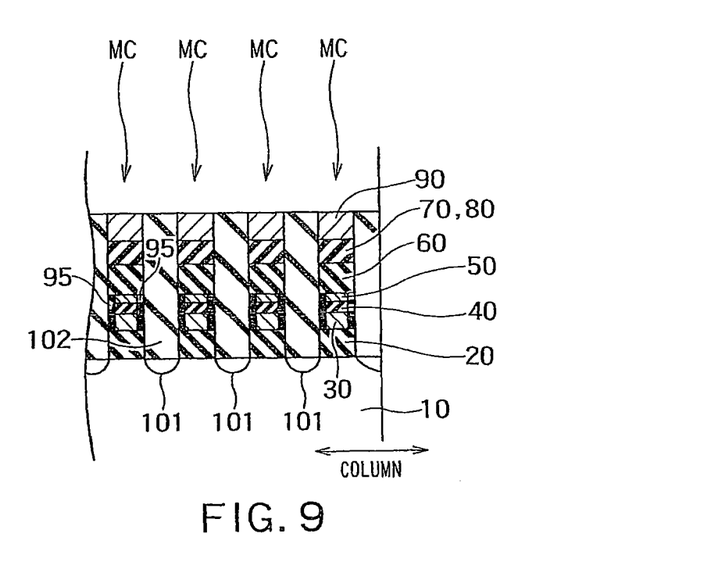
FIG. 9 is a cross-sectional view showing an example of a configuration of a memory according to a fourth embodiment.

FIG. 9 is a cross-sectional view showing an example of a configuration of a memory according to a fourth embodiment. FIG. 9 shows a cross-section along an extension direction of the bit lines BL (a column direction). The memory according to the fourth embodiment further includes an oxide film 95 on side surfaces of a stacked layer structure (the charge trap layer CT) including the floating gates 30, the IFD film 40, and the metal silicide layer 50. The oxide film 95 is provided to protect the side surfaces of the charge trap layer CT in the formation step of a diffusion layer 101. Reference numeral 102 denotes an interlayer dielectric film. Other configurations of the fourth embodiment can be identical to corresponding ones of the first embodiment. As shown in FIG. 9, in the direction of the bit lines BL, plural ones of the memory cells MC are connected in series by the diffusion layer 101 to form a NAND string.

The oxide film 95 is formed by exposing the charge trap layer CT to an oxidizing atmosphere to be annealed after the formation process of the control gates 90. Alternatively, the oxide film 90 can be formed by exposing the charge trap layer CT to a mixed atmosphere including an oxidizing atmosphere and a reducing atmosphere to be annealed. The oxide film 95 can be formed while the charge trap layer CT is exposed to a mixed atmosphere including an oxidizing atmosphere and a reducing atmosphere to suppress oxidization of the material of the control gates 90 (tungsten or a tungsten nitride film, for example). Other processes of the manufacturing method according to the fourth embodiment can be identical to corresponding ones of the manufacturing method according to the first embodiment. Accordingly, the fourth embodiment can achieve effects identical to those of the first embodiment. The fourth embodiment can be easily combined with the second and/or third embodiment.

In the above embodiments, the IFD film 40 is not indispensable. Therefore, the memory of the above embodiments can function normally, even if the IFD film 40 may not be provided on the floating gate 30.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:
1. A semiconductor device comprising:
a semiconductor substrate;
a first insulating film on the semiconductor substrate;
a charge trap layer on the first insulating film, the charge trap layer including a silicide layer made of a metal silicide and including a first semiconductor layer between the first insulating film and the silicide layer;
a second insulating film on the charge trap layer;
a control gate electrode on the second insulating film; and
a nitride film between the first semiconductor layer and the silicide layer.

2. The device of claim 1 further comprising:
a second semiconductor layer between the nitride film and the silicide layer.

3. The device of claim 2, wherein
the first and second semiconductor layers are made of polysilicon, and
the nitride film is made of a silicon nitride film.

4. The device of claim 2, wherein
the silicide layer is made of any one of $Ru_2Si_3$, $Ir_2Si_3$ and $Rh_2Si_3$,
the first and second semiconductor layers are made of polysilicon, and
the nitride film is made of a silicon nitride film.

5. The device of claim 1, wherein nitrogen is added to the silicide layer.

6. The device of claim 1, wherein the silicide layer is made of any one of $Ru_2Si_3$, $Ir_2Si_3$, and $Rh_2Si_3$.

7. The device of claim 1, wherein the second insulating film is made of a high-dielectric material having a higher relative permittivity than that of a silicon dioxide film.

* * * * *